United States Patent
Hoayun

(10) Patent No.: US 9,311,007 B2
(45) Date of Patent: Apr. 12, 2016

(54) CONFIGURING REGISTERS INTO LOW POWER CONDITIONS

(71) Applicant: Qualcomm Technologies International, Ltd., Cambridge (GB)

(72) Inventor: Paul Simon Hoayun, Willingham (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 172 days.

(21) Appl. No.: 14/138,729

(22) Filed: Dec. 23, 2013

(65) Prior Publication Data

US 2015/0178008 A1    Jun. 25, 2015

(51) Int. Cl.
| | | |
|---|---|---|
| *G06F 3/06* | (2006.01) | |
| *G06F 1/32* | (2006.01) | |
| *G11C 5/14* | (2006.01) | |

(52) U.S. Cl.
CPC ............ *G06F 3/0625* (2013.01); *G06F 1/3225* (2013.01); *G06F 1/3275* (2013.01); *G06F 3/0629* (2013.01); *G06F 3/0673* (2013.01); *G11C 5/148* (2013.01)

(58) Field of Classification Search
None
See application file for complete search history.

(56) References Cited

U.S. PATENT DOCUMENTS

| | | | |
|---|---|---|---|
| 2009/0302889 A1* | 12/2009 | Lichtensteiger et al. | ........ 326/62 |
| 2010/0271866 A1* | 10/2010 | Sakimura et al. | ............. 365/158 |
| 2013/0132756 A1 | 5/2013 | Priel et al. | |

FOREIGN PATENT DOCUMENTS

WO    WO 2014/051815 A1    4/2014

OTHER PUBLICATIONS

Ventakasubramanian et al., "State Retention Validation of C66x DSP core", 2013 14th International Workshop on Microprocessor Test and Verification, 2013.
GB Examination Report issued in related GB Application 1414024.8, dated Feb. 4, 2015.

* cited by examiner

*Primary Examiner* — Jared Rutz
*Assistant Examiner* — Christopher Do
(74) *Attorney, Agent, or Firm* — Procopio, Cory, Hargeaves & Savitch, LLP

(57) ABSTRACT

An integrated circuit has registers which it can place in a low power condition in which their state is lost; a power domain capable of reading the registers, the current operating mode of the domain being dependent on the state of the registers; a memory; and a configuration controller for configuring the registers. The configuration controller has access to a set of mappings. Each mapping indicates for bits represented in the memory the state of other bits storable in the registers. The configuration controller is configured to perform a register configuration operation by reading bits from the memory and populating the registers with a corresponding bit state.

14 Claims, 2 Drawing Sheets

CONFIGURING REGISTERS INTO LOW POWER CONDITIONS

This invention relates to configuring registers in an integrated circuit.

BACKGROUND

Many modern integrated circuits contain at least one domain whose mode of operation is configured by means of a set of registers. The registers are memory units accessible directly to the domain, each of which holds a data bit whose state indicates or helps to indicate the configuration state of the domain. For example, one domain on an integrated circuit might implement a UART (universal asynchronous receiver/transmitter). Registers accessible to the UART could indicate aspects of its configuration such as Baud rate, number of data bits, number of stop bits and parity protocol. When the UART is in operation it acts in accordance with those registers. More complex integrated circuits may have multiple domains, each with their own configuration registers.

Power consumption is a major concern in integrated circuit design. To reduce the power that an integrated circuit consumes, it is common to allow one or more domains of the integrated circuit to be powered down from time to time whilst other parts of the integrated circuit remain operational. For example, in an integrated circuit whose domains are a microprocessor, a UART and a radio transceiver, the UART could be powered down whilst the microprocessor and the radio transceiver remain operational. Then the UART could be reactivated when it is required for use.

When a domain is powered back up it can be desirable for it to return to operation in the same state as it was when it was powered down. This avoids the need to re-establish its state by performing some computation or by negotiating with other components. Since the domain's state is held in its registers, and those are part of the domain, the state of those registers is lost when the domain is powered down. Therefore, when the domain is being powered down it is normal to store the state of each of the domain's registers in an individual corresponding memory cell outside the domain. Then when the domain is powered back up its registers can be repopulated based on the state of that external memory.

This arrangement has a number of problems.

First, each of the external memory cells will to some extent leak energy when it is storing data. This leakage is not significant when the integrated circuit is built on a relatively large-scale geometry, but at smaller geometries the leakage can be greater and can significantly reduce the power savings that can be had from turning a domain off. This is expected to be particularly significant in future designs of integrated circuit that might implement much higher numbers of power domains than are common at present.

Second, it can take a significant time to read each of the external memory cells and store their contents in the registers of the domain. This can delay the domain's availability for use, or require it to be powered up well before it is to be used. This impacts the power savings from turning the domain off.

It would be desirable to have an improved way of retaining and restoring the state of a domain on an integrated circuit.

SUMMARY OF THE INVENTION

According to the present invention there is provided an integrated circuit comprising: registers for holding data, the integrated circuit being capable of placing the registers in a low power condition in which their state is lost; a power domain capable of operating in a plurality of modes, the domain being capable of reading the registers and the current operating mode of the domain being dependent on the state of the registers; memory; and a configuration controller for configuring the registers, the configuration controller having access to a set of mappings, each mapping indicating for the state of a first set of bits represented in the memory the state of a corresponding second set of bits storable in the registers, the first set having fewer bits than the second set; wherein the configuration controller is configured to perform a register configuration operation by reading the state of a first set of bits from the memory and populating the registers with the state of the second set of bits that corresponds to the state of that first set of bits.

The integrated circuit may be capable of placing the power domain in a low power condition in which it consumes less power than when the power domain is in a fully operational condition. The low power condition may be such that the domain consumes no power. The registers may be comprised in the power domain. Then the registers may enter the low power condition with the power domain. The registers may also be within a physical boundary that defines the perimeter of the components of the power domain, and within which substantially the only components are those of the power domain. The integrated circuit may be capable of controlling the power state of the power domain independently of other, and preferably of all or substantially all other, parts of the integrated circuit.

The integrated circuit may be capable of returning the power domain from its low power condition to its fully operational condition. The integrated circuit may be configured so as to cause the configuration controller to perform the register configuration operation when the power domain is returned from its low power condition to its fully operational condition. The configuration controller may automatically configure the registers as part of the powering up or enabling of the power domain.

The configuration controller may be configured to perform a memory configuration operation by reading the state of the registers as a second set of bits and populating a part of the memory with the state of the first set of bits that corresponds to the state of that second set of bits.

The integrated circuit may be configured so as to cause the configuration controller to perform the memory configuration operation when the power domain is being placed in its low power condition.

The integrated circuit may comprises further power domains that are capable of operating whilst the said power domain is in its low power condition.

The said power domain may function to provide an interface from the integrated circuit to an external entity. Communication parameters of the interface may be dependent on the state of the registers.

The memory may be capable of storing data when the registers are in their low power condition. The memory may be a random access memory. It may be a non-volatile re-programmable memory, such as a flash memory, or a volatile memory.

The integrated circuit may be defined on a single semiconductor substrate.

According to a second aspect of the present invention there is provided a method for operating an integrated circuit comprising: registers for holding data, the integrated circuit being capable of placing the registers in a low power condition in which their state is lost; a power domain capable of operating in a plurality of modes, the domain being capable of reading the registers and the current operating mode of the domain being dependent on the state of the registers; a memory; and a configuration controller for configuring the registers, the configuration controller having access to a set of mappings, each mapping indicating for the state of a first set of bits represented in the memory the state of a corresponding second set of bits storable in the registers, the first set having fewer bits than the second set; the method comprising performing by means of the configuration controller a register configuration operation by reading the state of a first set of bits from the memory and populating the registers with the state of the second set of bits that corresponds to the state of that first set of bits.

The method may comprise performing the register configuration operation as part of a process of causing the power domain to enter an operational state from a low power state.

The method may comprise performing by means of the configuration controller a memory configuration operation by reading the state of the registers as a second set of bits and populating a part of the memory with the state of the first set of bits that corresponds to the state of that second set of bits.

The integrated circuit may comprise two or more power domains of the type described above.

BRIEF DESCRIPTION OF THE DRAWINGS

The present invention will now be described by way of example with reference to the accompanying drawings. In the drawings.

DETAILED DESCRIPTION

Figure 1:
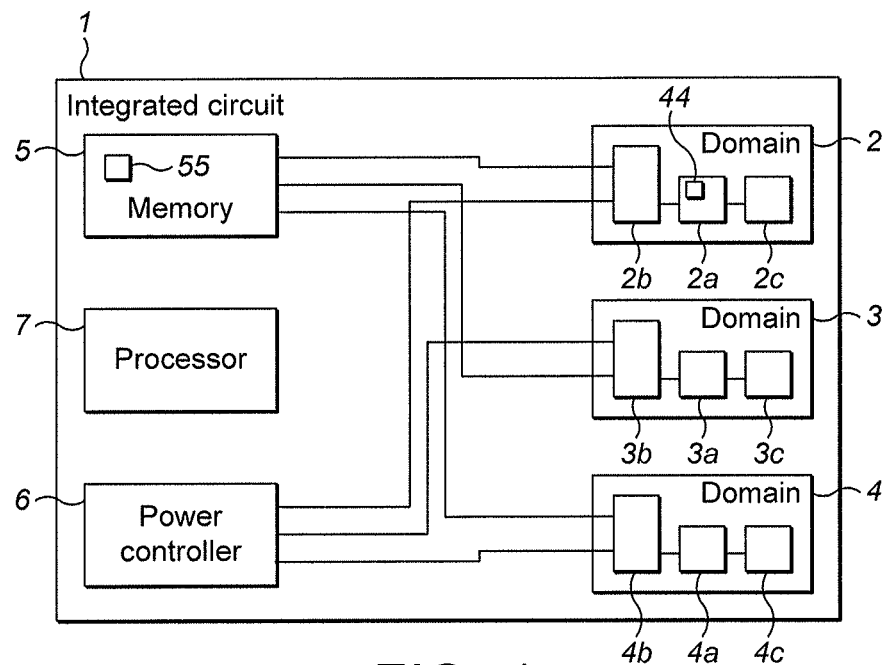
FIG. 1 illustrates an integrated circuit.

FIG. 1 shows an integrated circuit (IC) 1. The integrated circuit comprises multiple domains 2, 3, 4. Each domain has a set of registers 2a, 3a, 4a which hold the configuration of that domain when the domain is in use. The integrated circuit also has a set of memory cells 5 for storing the state of a domain when that domain is powered down. A power controller 6 controls the power supply to each domain to turn it on or off at appropriate times. When a domain is powered down its power consumption is reduced, and may be zero, but its registers will have lost their state.

Each domain includes a configuration block 2b, 3b, 4b. The configuration block acts as an interface between the memory cells 5 and the respective set of registers 2a, 3a, 4a. Each domain also includes a processing function 2c, 3c, 4c. The processing function operates when the domain is powered to perform analog and/or digital processing in dependence on the state of the respective registers 2a, 3a, 4a. The processing functions could, without limitation, include any one or more of a microprocessor, a state machine, a signal transmitter and/or receiver, an amplifier, a mixer and a filter. Each processing function is capable of operating in two or more modes or states, and adopts one of those modes or states in dependence on the values held in its register block. For this purpose, when the domain is in operation the processing function directly accesses registers of the domain's register block in order to read or set their state. The processing function may also be able to access data stored in memory 5, but this would normally be expected to take longer than accessing registers local to the domain. One reason for this is that the memory might be accessible by a contended bus. In contrast the registers may be readable and/or writable by dedicated bit lines from each register to the processing block of its domain. Another reason is that the memory might be accessible only via a memory controller. In contrast the bit values stored by the registers may be immediately accessible to the processing block of their domain.

Each configuration block 2b, 3b, 4b is hard-wired with a set of mappings between the state of one or more of the memory cells 5 and multiple ones of the respective registers 2a, 3a, 4a. This allows the state of a number of those registers to be represented and stored by a smaller number of the memory cells 5. This mechanism can help to reduce the IC's energy leakage whilst a domain is powered down.

The block of memory cells 5 includes a number of bit storage devices. Those devices could take any suitable form. For instance they could be charge storage cells in which the state of each cell is held by a storage capacitor, or they could be bistable latches such as flip-flops. The block of memory cells 5 could be a random access memory such as a DRAM or SRAM. The memory cells could be non-volatile memory that is capable of retaining its state when powered down, for example flash memory.

Each register in register block 2a, 3a, 4a is a bit storage device, most conveniently a single-bit storage device. It is conveniently a volatile storage device in that it will lose its state when not powered. It could be a charge storage cell whose state is retained by a storage capacitor, or it could be a bistable latch such as a flip-flop.

Details of the system will be described by reference to domain 2, as an example.

When one of the domains of the IC is being designed a number of common configuration states may be identified. For example, the registers of a UART domain 2 may be capable of holding any combination of the following states:

| Register set | Number of registers | Significance | Available configurations |
|---|---|---|---|
| 1 | 3 | Baud rate (b/s) | 1200, 2400, 4800, 9600, 19200, 38400, 57600, 115200 |
| 2 | 1 | Number of data bits | 7, 8 |
| 3 | 1 | Number of stop bits | 1, 2 |
| 4 | 1 | Parity | odd, even |

This array provides a total of 64 possibilities and requires a total of six registers to fully characterise it. However, it may be that during the design stage it can be recognised that only of few combinations of those possibilities are expected to be commonly used. Those might, for instance, be as follows:

| | | State of register set | | | |
|---|---|---|---|---|---|
| Combination | Configuration | 1 | 2 | 3 | 4 |
| 1 | 9600, 8, 1, even | 011 | 1 | 0 | 1 |
| 2 | 115200, 8, 1, even | 111 | 1 | 0 | 1 |
| 3 | 1200, 7, 2, odd | 000 | 0 | 1 | 0 |

Once these common combinations are known the respective configuration block can be set up so that it allows the common combinations to be represented efficiently by cells in block 5. To achieve this one or more of the cells in block 5 are considered to indicate—either individually or more typically in combination with each other—one of the predetermined common combinations. Then the configuration block maps between the combination indicated by that/those cell(s)

and the set of register states that corresponds to that combination. In the example indicated above, the combinations 1 to 3 may be indicated by two cells of block 5 and the configuration block can map between the cell states and the register states in the following way:

| Cell states | Indicated combination | State of register set | | | |
|---|---|---|---|---|---|
| | | 1 | 2 | 3 | 4 |
| 00 | 1 | 011 | 1 | 0 | 1 |
| 01 | 2 | 111 | 1 | 0 | 1 |
| 10 | 3 | 000 | 0 | 1 | 0 |

The integrated circuit is arranged so that when the domain is powered up the configuration block receives the state of the relevant cells of block 5 and sets the relevant registers of the domain to the values that correspond to the combination indicated by the values of those cells taken collectively.

In this way, the state of six bit value registers of the UART domain 2 can, in this example, be indicated by just two bit value cells of the memory cell block 5. In comparison with a prior approach in which the state of every bit value register of a domain that can be directly repopulated on restart is stored by a corresponding bit value storage cell, this approach reduces the energy leakage whilst those states are being stored by the cells. This is because fewer cells are needed to indicate which of the predetermined combinations is to be used than would be needed to store the state of each register individually. In another example, a domain could have 20 registers and 16 common states could be identified. In that example, the use of a configuration block would allow the number of cells needed to hold the state of the domain for common configurations to be reduced from 20 to 4.

The arrangement of the configuration blocks 2b, 3b, 4b will now be described.

Figure 2:
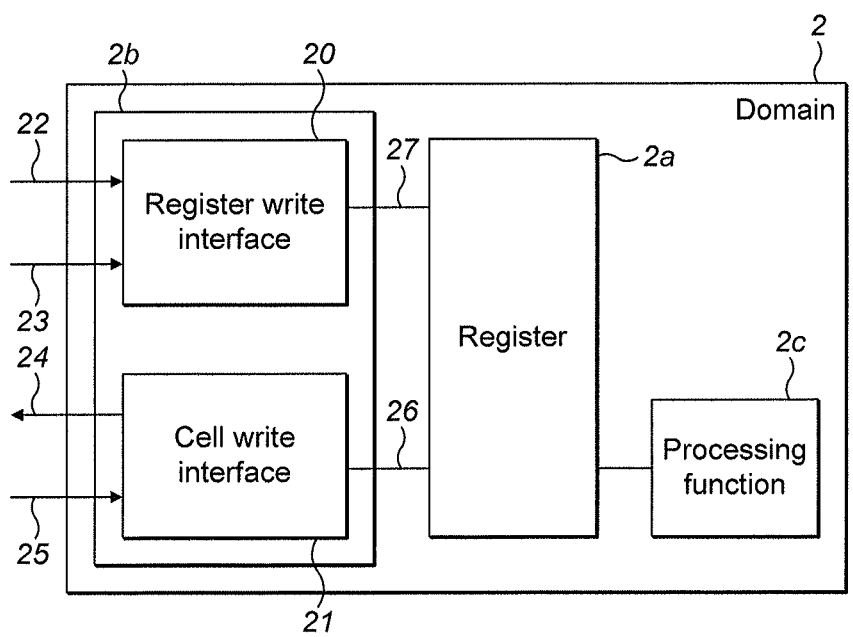
FIG. 2 is a block diagram of a configuration block.

FIG. 2 shows an example of configuration block 2b as part of domain 2. The configuration block 2b of FIG. 2 comprises a register write interface 20 and a cell write interface 21. The register write interface maps from the one or more of the cells 5 to the registers 2a when the domain 2 is activated. Its purpose is to populate the registers based on the state held in the cells. The cell write interface maps from multiple ones of the registers 2a to the cells 5 when the domain is deactivated. Its purpose is to store the appropriate state in the cells 5 so that when the domain is later reactivated the registers 2a can be repopulated exactly as they were immediately before the domain was deactivated.

Figure 3:
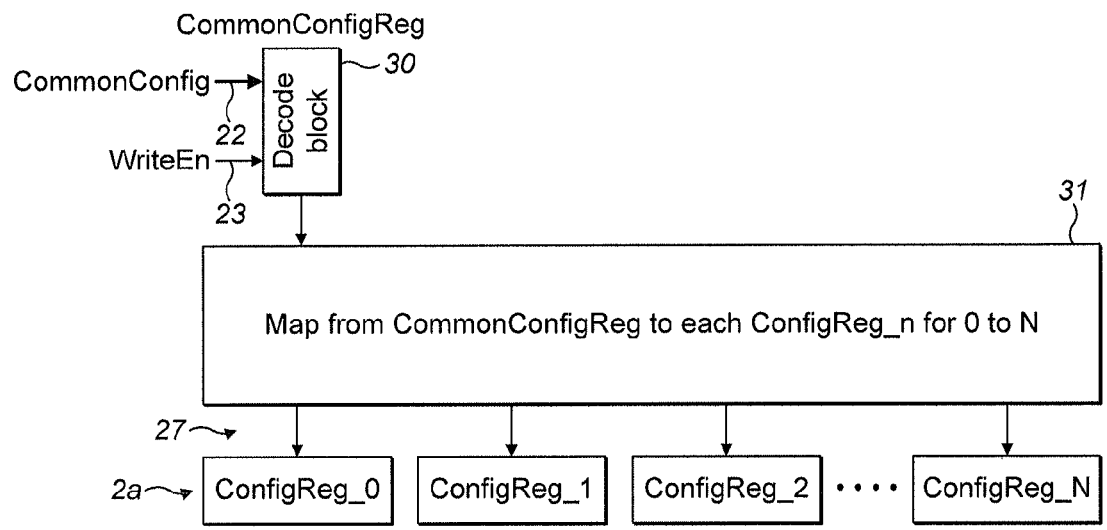
FIG. 3 illustrates one type of configuration circuit.

One functional circuit for the register write interface 20 is shown in FIG. 3. In this example the register write interface comprises a configuration decode block 30 and a configuration mapping block 31. The configuration decode block 30 receives a data input 22 ("CommonConfig") from the memory cell block 5 and a write enable input 23 ("WriteEn") from the power controller 6. The data input indicates the states of those cells of cell block 5 that hold a stored configuration for the domain. The power controller is configured to assert and then de-assert the write enable signal during the powering up of the domain, to cause the registers to be configured at the appropriate time. Instead of the write enable signal coming directly from the power controller 6, it could be asserted temporarily by the domain itself as part of its power-up sequence. The configuration decode block receives the bit values indicating the states of the relevant cells from cell block 5. It is configured to decode those values to a representation of the corresponding one of the predefined common register combinations. For instance, in the illustration given above it could decode the cell input "01" to register combination "2". It outputs that combination to the mapping block 31 only when the write enable signal 23 is asserted.

The mapping block 31 is configured to map from each predetermined common register combination to the corresponding set of register values. For instance, in the illustration given above it could map from register combination "2" to register values "1, 1, 1, 1, 0, 1". When the mapping block receives a combination from the configuration decode block 30 it writes the mapped register values to the appropriate registers 2a via a link 27.

Each of the configuration decode block 30 and the mapping block 31 could be implemented in hardware or as software running on a microprocessor. However, it is convenient for them to be implemented solely in hardware since that would be expected to allow the registers to be configured more quickly and at lower energy expenditure. The configuration block 2b could thus be hard-wired to map from multiple predetermined common cell configurations (received at 22) to the corresponding register settings (output at 27).

At the time when the integrated circuit is fabricated the configuration block 2b could be defined in such a way that it does not map from a specific cell combination to a specific register combination. Then it could be programmed to perform that mapping in hardware by means of one-time-configurable circuit elements such as fusible links. The fusible links could, for example, bind appropriate nodes in the mapping block 31 high or low corresponding to a particular register combination. In this way, after the integrated circuit has been fabricated and, optionally, packaged, it can be configured for a certain set of common register mappings. This can allow the integrated circuit to be used for a wider range of low-power functions without needing to change its fabrication process.

The common configuration register identification block could be integrated with the mapping block 31 as a single functional element.

When the registers 2a are not being programmed by the mapping block 31 they are accessed as normal by the circuitry 2c of the relevant domain. That circuitry 2c can read the registers to determine its present operating state, and write to the registers to define a new operating state.

Figure 4:
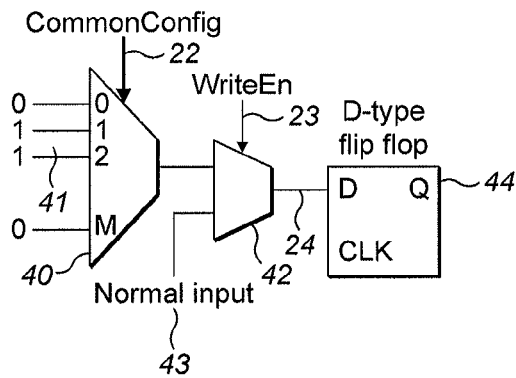
FIG. 4 illustrates another type of configuration circuit.

FIG. 4 illustrates an alternative design for the configuration block 2b. In this design the data input 22 ("CommonConfig") from the memory cell block 5 is applied to a multiplexer 40. The multiplexer 40 is arranged to select, in dependence on the value indicated by the data input 22 one of a number of register configuration inputs 41, each of which is either high ("1") or low ("0"). Each register configuration input could be hard-wired to its value, and could be set to that value either at initial manufacture or by a one-time writing process such as the blowing of a circuit element such as a fusible link. The multiplexer 40 outputs the value of the selected register configuration input. The output of the multiplexer 40 passes to a second multiplexer 42. The multiplexer 42 is arranged to select, in dependence on the write enable input 23 ("WriteEn") from the power controller 6, either the value received from multiplexer 40 or a value received from a third input 43 ("Normal input") which is received from the functional circuitry 2c of the relevant block. The output 24 of the multiplexer 42 passes to the D input of a D-type flip-flop 44. That flip-flop is one of the registers in register block 2a. When the write enable input 23 is asserted, the multiplexer 42 selects the input from multiplexer 40 and passes its value to the D input of the flip-flop. This causes that value to be written to and stored by the D-type flip-flop. This happens when the domain is being powered up. When the write enable input is disabled the multiplexer selects the input 43 and passes its value to the D input of the flip-flop. This allows the circuitry 2c to write to the D-type flip-flop during normal operation.

The circuitry of FIG. 4 is replicated for each register that is to be configured, with the register configuration inputs 41 for each multiplexer 40 being configured as appropriate for the predetermined common register configurations. For example, in the illustration given above the register configuration inputs to the multiplexer corresponding to the first register would be 0, 1, 0, indicating that for configuration 1 the register should be set to the value 0, for configuration 2 the register should be set to the value 1 and for configuration 3 the register should be set to the value 0.

This circuit allows all the registers 2a to populated during a single clock cycle. This helps the domain 2 to reach an operational state quickly.

Referring again to FIG. 2, the configuration block 2a includes cell write interface 21. The purpose of the cell write interface is to translate the current combination of values of registers 2a into the appropriate cell states and write those states to cells of cell block 5 when the domain 2 is powered down. This can be done by the circuit of FIG. 5. This circuit is similar to that of FIG. 4 and is replicated for each of the cells (e.g. cell 55) that are to be used to represent the state of the domain in question. In this design a register state input 26 ("Register States") from the register block 2a is applied to a multiplexer 53. Input 26 indicates the values of all of the registers of the domain that are to be re-populated when it is powered up. The multiplexer 53 is arranged to select, in dependence on the value indicated by the state input 26 one of a number of cell configuration inputs 51, each of which is either high ("1") or low ("0"). Each cell configuration input could be hard-wired to its value, and could be set to that value either at initial manufacture or by a one-time writing process such as the blowing of a circuit component such as a fusible link. The multiplexer 53 outputs the value of the selected cell configuration input. The output of the multiplexer 53 passes to a gate 54. The gate 54 is arranged to pass the output of multiplexer 53 to the cell 55 only when input 25 ("WriteBack Enable") is asserted. Input 25 is received from the power controller, or from power-down circuitry of the domain in question, and is asserted temporarily during power down to cause the encoded values representing the register configuration to be written to the cell block 5. The output 24 of the multiplexer 54 passes to the respective memory cell 55. WriteBack Enable input 25 could be continuously asserted, so that the state of the registers is always being written back to the cell block 5. This may reduce the time taken for the domain to power down.

In some situations there may be no need for the domain to write back to the registers when it is powered down. For example, the state of the registers might not have changed since the domain was powered up, or the device may be in a mode of operation in which it is desired to power up the domain in the same initial state each time.

The cell configuration inputs 51 for each multiplexer 53 are configured as appropriate for the predetermined common register configurations. For example, in the illustration given above, the cell configuration inputs to the multiplexer corresponding to the first cell would be set up so that the multiplexer 53 behaves as follows:

| Register states input 26 | Output to multiplexer 54 |
|---|---|
| 011101 | 0 |
| 111101 | 0 |
| 000010 | 1 |

Figure 5:
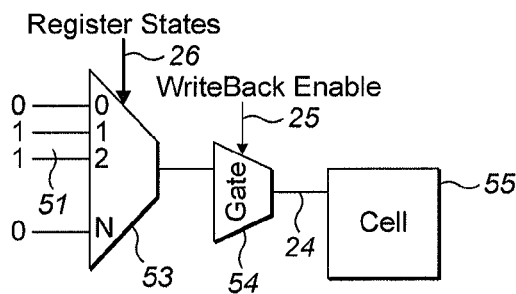
FIG. 5 illustrates a circuit for writing register values to memory cells.

In practice the functional logic illustrated in FIGS. 3 to 5 could be optimised to smaller logical components.

As described above, the configuration block 2b receives cell values from the cell block 5 in order to configure the registers appropriately. Those cell values could be provided to the configuration block by hard-wired links between the appropriate cells and the corresponding configuration block. Alternatively, the cell values could be provided by means of a processor 7 external to the domain whose registers are being configured. The processor 7 is aware that the domain is being powered up either as a result of that fact being signalled to it, e.g. from the power controller, or because it is the processor 7 that has caused the domain to be powered up. The processor 7 reads the appropriate cells in memory 5 and writes their values to input 22.

The number of cells that hold and indicate the common configuration for a domain could be one (if the number of common configurations is two), two or more.

In the example given above the power domain 2a is a UART. It is advantageous if the power domain that is to be configured in the manner described above is for providing a communications interface from the integrated circuit to an entity separate from the integrated circuit. That entity could be coupled wirelessly or in a wired manner to the integrated circuit. When the domain provides a communications interface, it can conveniently be powered down when it is not in use and then restored to operational mode when required with the communications state that it had when it was powered down. By making the process of configuring the domain relatively quick, and by making the storing of the domain's state relatively power efficient it becomes more advantageous to power down the communication interface during short breaks in communications. This can provide a significant power saving.

The process of populating the registers 2a based on the state of memory 5 can be done when a domain is being powered up, as described above. It may be done at other times. For example, it may be done while a domain is in operation in order to switch the domain quickly from one mode of operation to another.

A domain could be located on the integrated circuit as a contiguous block of components. The registers of the domain could be located within that block. Alternatively the components of the domain could be located as two or more separate blocks.

The mechanism as described above only allows the registers of a domain to be set up with a certain subset of their potential configurations. It may be desirable to enable all configurations to be set up. To do this one value of the cell states can be reserved.

That value could conveniently be all ones or all zeros. The configuration block is configured so that when it reads that reserved value, rather looking up a pre-defined register setting corresponding to that combination it retrieves a further set of cell states from the memory 5. The further set of cell states could be stored in a predetermined location that is reserved for this purpose. The further set of cell states comprises one bit value for each bit value that can be represented by the registers that are to be set up. The configuration block then writes the register states as represented by those values. Correspondingly, the configuration block can be set up so that when the register states are to be stored in memory 5, e.g. when the block is being powered down, if the current state of the registers does not match any of the predetermined register states then it stores the reserved value in the memory cells that are read by default during set up of the registers and stores the complete set of bit values of the registers in another location in the memory 5, for example in a predetermined location.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit including a power domain capable of operating in a plurality of modes, the integrated circuit comprising:
    registers for holding data, the integrated circuit being capable of placing the registers in a low power condition in which their state is lost,
    wherein the power domain is capable of reading the registers and a current operating mode of the power domain is dependent on the state of the registers;
    a memory; and
    a configuration controller having access to a set of mappings, each mapping indicating for the state of a first set of bits represented in the memory the state of a corresponding second set of bits storable in the registers, the first set having fewer bits than the second set, the configuration controller operable to perform a register configuration operation by reading the state of a first set of bits from the memory and populating the registers with the state of the second set of bits that corresponds to the state of that first set of bits,
    wherein the state of the second set of bits represents the state of all combinations of the registers, while the state of the first set of bits represents the state of a predetermined number of common combinations of the registers.

2. An integrated circuit as claimed in claim 1, wherein the integrated circuit is capable of placing the power domain in a low power condition in which it consumes less power than when the power domain is in a fully operational condition.

3. An integrated circuit as claimed in claim 2, wherein the registers are comprised in the power domain.

4. An integrated circuit as claimed in claim 2, wherein the integrated circuit is capable of returning the power domain from its low power condition to its fully operational condition, and wherein the integrated circuit is configured so as to cause the configuration controller to perform the register configuration operation when the power domain is returned from its low power condition to its fully operational condition.

5. An integrated circuit as claimed in claim 2, wherein the configuration controller is configured to perform a memory configuration operation by reading the state of the registers as a second set of bits and populating a part of the memory with the state of the first set of bits that corresponds to the state of that second set of bits.

6. An integrated circuit as claimed in claim 5, wherein the integrated circuit is configured so as to cause the configuration controller to perform the memory configuration operation when the power domain is being placed in its low power condition.

7. An integrated circuit as claimed in claim 2, wherein the integrated circuit comprises further power domains that are capable of operating whilst the said power domain is in its low power condition.

8. An integrated circuit as claimed in claim 1, wherein the said power domain functions to provide an interface from the integrated circuit to an external entity and the communication parameters of the interface are dependent on the state of the registers.

9. An integrated circuit as claimed in claim 1, wherein the memory is capable of storing data when the registers are in their low power condition.

10. An integrated circuit as claimed in claim 1, wherein the memory is a random access memory.

11. An integrated circuit as claimed in claim 1, wherein the integrated circuit is defined on a single semiconductor substrate.

12. A method for operating an integrated circuit having a power domain capable of operating in a plurality of modes, the integrated circuit including registers for holding data, the integrated circuit being capable of placing the registers in a low power condition in which their state is lost, wherein the power domain is capable of reading the registers and a current operating mode of the power domain is
    dependent on the state of the registers; a memory; and a configuration controller having access to a set of mappings, each mapping indicating for the state of a first set of bits represented in the memory the state of a corresponding second set of bits storable in the registers, the first set having fewer bits than the second set the method comprising:
    performing, by means of the configuration controller, a register configuration operation by reading the state of a first set of bits from the memory; and
    populating the registers with the state of the second set of bits that corresponds to the state of that first set of bits,
    wherein the state of the second set the state of all combinations of the registers, while the state of the first set of bits represents the state of a predetermined number of common combinations of the registers.

13. A method as claimed in claim 12, comprising performing the register configuration operation as part of a process of causing the power domain to enter an operational state from a low power state.

14. A method as claimed in claim 12, comprising performing by means of the configuration controller a memory configuration operation by reading the state of the registers as a second set of bits and populating a part of the memory with the state of the first set of bits that corresponds to the state of that second set of bits.

* * * * *